United States Patent [19]
Shi et al.

[11] Patent Number: 5,693,956
[45] Date of Patent: Dec. 2, 1997

[54] INVERTED OLEDS ON HARD PLASTIC SUBSTRATE

[75] Inventors: Song Q. Shi, Phoenix, Ariz.; Hsing-Chung Lee, Calabasas, Calif.; Cheng-Ping Wei, Gilbert, Ariz.

[73] Assignee: Motorola, Schaumburg, Ill.

[21] Appl. No.: 688,632

[22] Filed: Jul. 29, 1996

[51] Int. Cl.$^6$ .......................... H01L 33/00; H01L 35/24; H01L 51/00
[52] U.S. Cl. .................... 257/40; 257/88; 257/91; 257/100; 257/103; 257/679; 257/680
[58] Field of Search ........................... 257/40, 103, 99, 257/88, 100, 91, 679, 680

[56] References Cited

U.S. PATENT DOCUMENTS

| | | | |
|---|---|---|---|
| 5,153,073 | 10/1992 | Ohnuma et al. | 428/461 |
| 5,408,109 | 4/1995 | Heeger et al. | 257/103 X |
| 5,482,896 | 1/1996 | Tang | 437/209 |
| 5,530,269 | 6/1996 | Tang | 257/88 |
| 5,583,350 | 12/1996 | Norman et al. | 257/88 |

*Primary Examiner*—William Mintel
*Attorney, Agent, or Firm*—Eugene A. Parsons

[57] ABSTRACT

A hard plastic card display device including a hard plastic card having a major surface and a driver circuit. A display, including a plurality of inverted organic light emitting diodes, is formed on the major surface and coupled to the driver circuit.

6 Claims, 1 Drawing Sheet

INVERTED OLEDS ON HARD PLASTIC SUBSTRATE

FIELD OF THE INVENTION

The present invention pertains to organic devices and more specifically to organic light emitting diodes.

BACKGROUND OF THE INVENTION

At the present time devices utilizing organic displays, such as organic or polymer light emitting devices, are potential candidates for a great variety of virtual and direct view type displays, such as digital watches, telephones, lap-top computers, pagers, cellular telephones, calculators and the like. Unlike, inorganic semiconductor light emitting devices, organic light emitting device are generally simple and relatively easy and inexpensive to fabricate. Also, a variety of colors and large-area devices are easily attained.

Conventional organic light emitting diodes (OLEDs) are built on glass substrates because glass is transparent and because of the low permeability of glass to oxygen and water vapors, which lead to corrosion and other forms of degradation, and are a detriment to the reliability of organic LEDs. In general, a two-dimensional OLED array for image manifestation apparatus applications as known in the art is composed of a plurality of OLEDs (one or more of which form a pixel) arranged in rows and columns. Each individual OLED in the array is generally constructed of overlying layers starting with a light transmissive first electrode formed on the substrate, an organic electroluminescent medium deposited on the first electrode, and a metallic electrode on top of the organic electroluminescent medium.

Presently, smaller and less expensive applications for image manifestation devices are being considered. Specifically, small, lightweight, inexpensive displays are needed for use in combination with smart cards and smart card pagers. While simpler and less expensive than inorganic LEDs, OLEDs formed on glass substrates still result in greater weight, and a complicated and therefore expensive integration process, particularly the interconnects.

It would be highly advantageous, therefore, to remedy the foregoing and other deficiencies inherent in the prior art.

Accordingly, it is an object of the present invention to provide new and improved OLEDs formed on a plastic substrate.

Another object of the invention is to provide a new and improved method of forming an OLED on a plastic substrate.

And another object of the invention is to provide OLEDs formed on a plastic substrate which simplify integration processes.

Yet another object of the present invention is to provide OLEDs formed on a plastic substrate forming an inexpensive and light-weight display for plastic card applications.

SUMMARY OF THE INVENTION

Briefly, to achieve the desired objects of the instant invention in accordance with a preferred embodiment thereof, provided is an organic light emitting diode device including a hard plastic substrate having a major surface, and an inverted organic light emitting diode formed on the major surface of the hard plastic substrate.

Further provided is an inverted organic light emitting diode which includes a moisture and oxygen barrier layer formed on the major surface, a plurality of interconnects formed on the barrier layer, a metal alloy formed on the plurality of interconnects, an organic electroluminence media layer formed on the metal alloy, and a transparent conductor formed on the organic electroluminence media layer.

Also provided is a method of fabricating the organic light emitting diode device.

Further provided is a hard plastic card display device including a hard plastic card having a major surface and a driver circuit, and a display formed on the major surface and coupled to the driver circuit, the display including a plurality of inverted organic light emitting diodes.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENT

Figure 1:
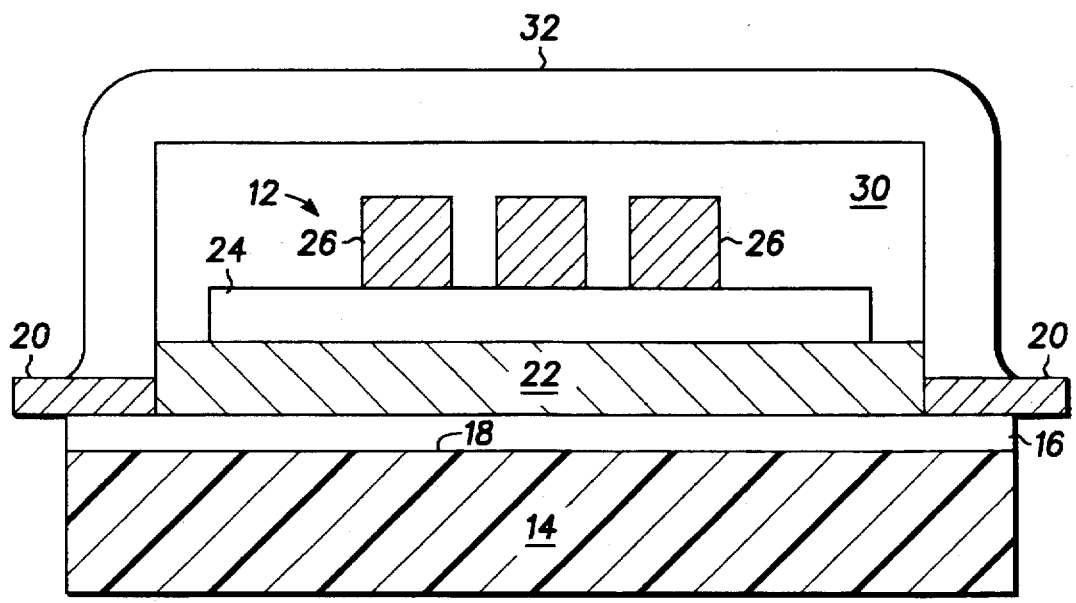
FIG. 1 is a simplified side view of a OLED device according to the present invention.

Turning now to the drawings in which like reference characters indicate corresponding elements throughout the several views, attention is first directed to FIG. 1 which illustrates a simplified cross-sectional view of an organic light emitting diode device generally designated 10. Device 10 includes a plurality of organic light emitting diodes (OLEDs), generally designated 12, mounted on a plastic substrate 14 in accordance with the present invention. In the present embodiment, plastic substrate 14 is opaque, preventing passage of light emitted by OLEDs 12. This requires a unique construction of OLEDs 12 in an inverted orientation.

Plastic is susceptible to the permeation of oxygen and moisture to some extent. In this instance where OLEDs 12 are formed on a plastic substrate, there is present the need to reduce and eliminate the diffusion of oxygen and moisture through the plastic substrate which, as previously stated, leads to degradation of the OLEDs. Therefore, a moisture and oxygen barrier layer 16 is first deposited on a major surface 18 of plastic substrate 14. A plurality of OLEDs 12 are then formed on barrier layer 16 in an array of pixels, will each pixel being formed of one or more of OLEDs 12.

Still referring to FIG. 1, a plurality of OLEDs 12 are made by forming a plurality of interconnects 20 on barrier layer 16, forming a metal alloy layer 22 on a plurality of interconnects 20, forming an organic electroluminence media layer 24 on metal alloy layer 22, and forming a transparent conductor 26 on organic electroluminence media layer 24.

Metal alloy layer 22 acts as a cathode for which OLEDs 12, generally includes a thin layer of a low work function metal and can be opaque, as light is emitted away from substrate 14. Organic electroluminence media layer 24 is generally comprised of a hole transport layer, an emitting layer and an electron transport layer. Transparent conductor 26 is a conductive material, such as indium-tin-oxide (ITO) or the like, acting as the anode for OLEDs 12.

The array of organic LEDs (OLEDs 12), and especially metal alloy layer 22, is susceptible to oxygen and moisture in the surrounding atmosphere and must, therefore, be passivated to provide reliability and a reasonable longevity. Partial protection is provided by barrier layer 16. The barrier layer 16 is made of inorganic dielectric medium such as silicon oxide, silicon nitride or non-conductive metal oxides such as aluminum oxide. Barrier layer 16 can also be made of alternative layers of metal/polymer such as aluminum/parylene or alternative inorganic dielectric medium/polymers such as SiO2/cyclotene to reduce an/or eliminate the diffusion of oxygen and moisture through the plastic substrate. When an alternative-layers scheme is used, the final layer which is the major surface of layer 16 needs to be made of insulating material to prevent any possible shorting of the array. Passivation is further accomplished by encapsulating OLEDs 12 in a transparent dielectric medium layer 30. Dielectric medium layer 30 is used as a physical barrier to stop the diffusion of moisture vapor and oxygen through substrate 14, thereby damaging OLEDs 12. Dielectric medium layer 30 is preferably formed from one of silicon monoxide (SiO), silicon oxide (SiOx), silicon dioxide (SiO2) or silicon nitride (Si3N4) and is generally applied by thermal evaporation, sputtering or PECVD methods. Device 10 is preferably sealed with a globe top epoxy encapsulant 32.

Transparent dielectric medium 30 forms a buffer between globe top epoxy encapsulant 32 and OLEDs 12 to reduce the risk of chemical attack on the OLED array during the applying and curing of the globe top epoxy encapsulant.

Figure 2:
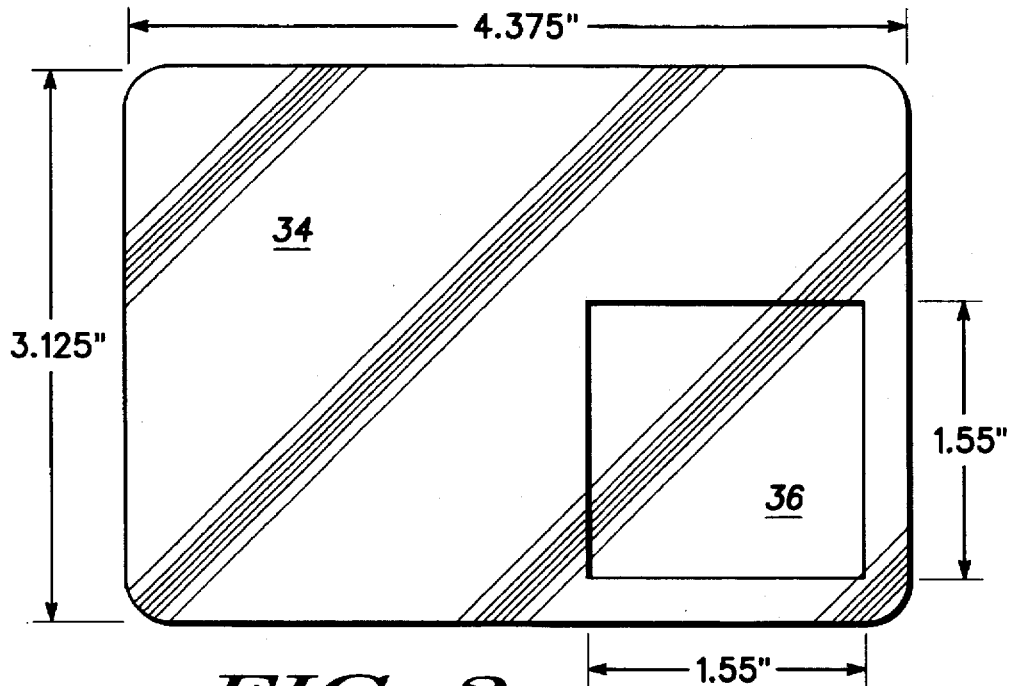
FIG. 2 is a top plan view of a hard plastic card.
Figure 3:
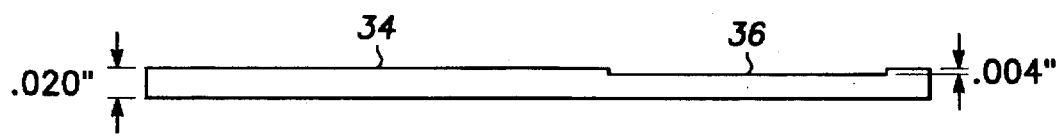
FIG. 3 is a side plan view illustrating the well of the hard plastic card of FIG. 2.

The plastic substrate 14 is selected from a variety of commercially available substrates such as those used for credit cards, identification and smart cards which are mostly made of polyvinylene chloride (PVC). The plastic substrate can also be made of other commercially available materials including polyolefins, polyacrylates, fluorolated polymers, polyimides, polysulfones with fillers such as glass, metal oxides, silicon oxides, etc. and plasticizers such as dialkylphthalates, trialkylphosphates, etc. The plastic substrates with flooded copper such as FR-4 boards used for printed circuit boards (PCBs), which is well known to those skilled in the art, can also be used. Turning now to FIGS. 2 and 3, plastic substrate 14 can be a hard plastic card 34, of the type often associated with smart cards and identification cards. Driver electronics and memory chips can be embedded first in the hard plastic card. The interconnects are also directly fabricated on the hard plastic card. Thus when OLED device 10 is formed directly onto hard plastic card 34, many intermediate steps in forming a display on the card can be eliminated, reducing cost. OLED device 10 can be formed directly on a major surface of card 34, or as illustrated, can be formed in a well 36 formed in the major surface of card 34. In this case, encapsulant 32 seals device 10 into well 36. After lamination with a plastic film, a smart card with IC and display is obtained.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An organic light emitting diode device comprising:

a plastic substrate having a major surface including a well; and an inverted organic light emitting diode formed in the well on the major surface of the plastic substrate and inverted so as to emit light away from the plastic substrate, the inverted organic light emitting diode including a moisture and oxygen barrier layer formed in the well on the major surface, a plurality of interconnects formed on the barrier layer, a metal alloy formed on the plurality of interconnects, an organic electroluminence media layer formed on the metal alloy, and a transparent conductor formed on the organic electroluminence media layer.

2. An organic light emitting diode device as claimed in claim 1 where the plastic substrate includes a plastic card selected from one of a smart card, a credit card, and an identification card.

3. An organic light emitting diode device as claimed in claim 1 further including a transparent dielectric media encapsulating and sealing the organic light emitting diode in the well.

4. An organic light emitting diode device as claimed in claim 1 where the plastic substrate includes a driver circuit coupled to the plurality of interconnects.

5. A plastic card display device comprising:

a plastic card selected from one of a smart card, a credit card, and an identification card, including a major surface defining a well and a driver circuit;

a display formed on the major surface and coupled to the driver circuit, the display including a plurality of inverted organic light emitting diodes positioned in the well and encapsulated and sealed by a transparent dielectric media, the inverted organic light emitting diodes being inverted so as to emit light away from the plastic substrate, each inverted organic light emitting diode including a moisture and oxygen barrier layer formed on the major surface, a plurality of interconnects formed on the barrier layer and coupled to the driver circuit, a metal alloy formed on the plurality of interconnects, an organic electroluminence media layer formed on the metal alloy, and a transparent conductor formed on the organic electroluminence media layer.

6. A display device as claimed in claim 5 wherein the plurality of organic light emitting diodes are formed in an array having a plurality of pixels defined by rows and columns.

* * * * *